US011627023B2

(12) United States Patent
Hasegawa et al.

(10) Patent No.: US 11,627,023 B2
(45) Date of Patent: Apr. 11, 2023

(54) SIGNAL TRANSMISSION APPARATUS

(71) Applicants: DENSO CORPORATION, Kariya (JP); ROHM Co., Ltd., Kyoto (JP)

(72) Inventors: Junichi Hasegawa, Kariya (JP); Yusuke Michisita, Kariya (JP); Kazuma Takahashi, Kariya (JP); Daiki Yanagishima, Kyoto (JP); Masahiko Arimura, Kyoto (JP)

(73) Assignees: DENSO CORPORATION, Kariya (JP); ROHM CO., LTD., Kyoto (JP)

( * ) Notice: Subject to any disclaimer, the term of this patent is extended or adjusted under 35 U.S.C. 154(b) by 0 days.

(21) Appl. No.: 17/585,877

(22) Filed: Jan. 27, 2022

(65) Prior Publication Data
US 2022/0150096 A1 May 12, 2022

Related U.S. Application Data

(63) Continuation of application No. PCT/JP2020/028890, filed on Jul. 28, 2020.

(30) Foreign Application Priority Data

Jul. 31, 2019 (JP) .............................. JP2019-141127
May 27, 2020 (JP) .............................. JP2020-092232

(51) Int. Cl.
*H04L 7/033* (2006.01)
*H04L 27/14* (2006.01)
*H04L 7/027* (2006.01)

(52) U.S. Cl.
CPC .............. *H04L 27/14* (2013.01); *H04L 7/027* (2013.01); *H04L 7/033* (2013.01)

(58) Field of Classification Search
CPC ......... H04L 27/12; H04L 27/14; H04L 7/027; H04L 7/033; H03K 17/691; H03K 19/0175
See application file for complete search history.

(56) References Cited

U.S. PATENT DOCUMENTS

| | | | |
|---|---|---|---|
| 2004/0037094 A1* | 2/2004 | Muegge | H02M 3/33515 363/21.16 |
| 2012/0212251 A1 | 8/2012 | Yanagishima et al. | |
| 2015/0137843 A1 | 5/2015 | Yanagishima et al. | |
| 2017/0194959 A1 | 7/2017 | Yanagishima et al. | |
| 2018/0324920 A1* | 11/2018 | Luccato | H05B 45/12 |
| 2019/0334522 A1 | 10/2019 | Yanagishima et al. | |

* cited by examiner

*Primary Examiner* — Siu M Lee
(74) *Attorney, Agent, or Firm* — Posz Law Group, PLC

(57) ABSTRACT

In a transmission circuit, a first pulse signal with a first frequency and a second pulse signal with a second frequency are output according to a rising edge and a falling edge of a first input signal, respectively. When a second input signal indicates an active level, the second pulse signal is output according to the falling edge of the first input signal and the second frequency is changed to a third frequency. In a reception circuit, a first level of a first output signal is changed to a second level according to a first induced signal via a transformer, the second level of the first output signal is changed to the first level according to a second induced signal via the transformer, and a second output signal is changed to an active level when a frequency of the second induced signal has changed to the third frequency.

7 Claims, 13 Drawing Sheets

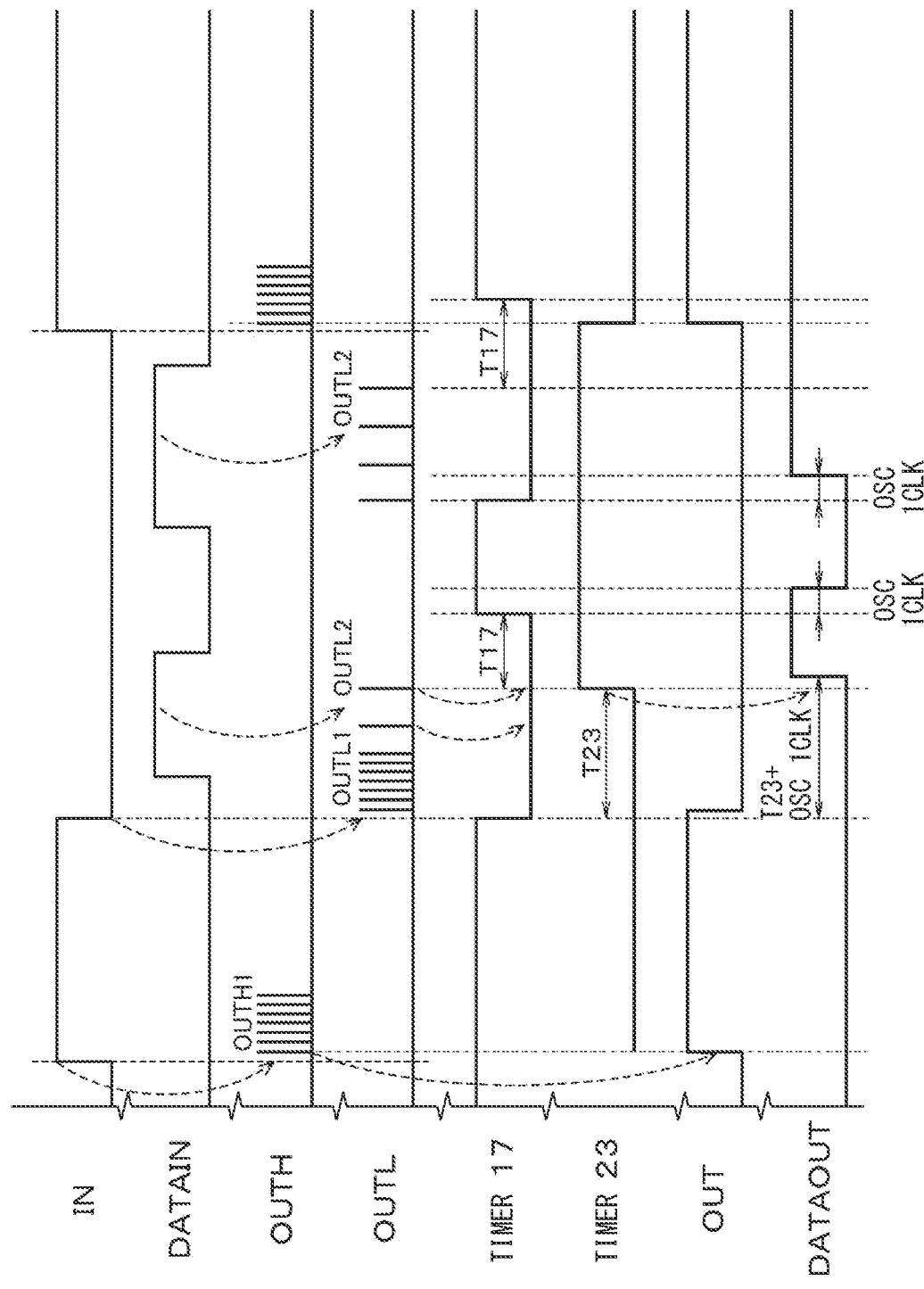

SIGNAL TRANSMISSION APPARATUS

CROSS REFERENCE TO RELATED APPLICATIONS

The present application is a continuation application of International Patent Application No. PCT/JP2020/028890 filed on Jul. 28, 2020, which designated the U.S. and claims the benefit of priority from Japanese Patent Application No. 2019-141127 filed on Jul. 31, 2019, and Japanese Patent Application No. 2020-092232 filed on May 27, 2020. The entire disclosures of all of the above applications are incorporated herein by reference.

TECHNICAL FIELD

The present disclosure relates to a signal transmission apparatus including (i) a transmission circuit to which a signal is input from an outside, (ii) a transformer, and (iii) a reception circuit to which a signal is input via the transformer.

BACKGROUND

For example, there is disclosed a signal transmission apparatus as follows. On the transmission side, according to a change in the binary levels of an input signal, a flip-flop set signal and a flip-flop reset signal are generated in pulse signals in N times and separately outputted into two signal path systems. The pulse signals are transmitted via two transformers, respectively. On the reception side, when the pulse signals are each received M (<N) times, a set signal and a reset signal are given to the flip-flop. In the above configuration, two signal path systems are used to set/reset the flip-flop.

SUMMARY

According to an example of the present disclosure, a signal transmission apparatus is provided to include a transmission circuit, and a reception circuit. In the transmission circuit, a first pulse signal with a first frequency and a second pulse signal with a second frequency are output according to a rising edge and a falling edge of a first input signal, respectively. When a second input signal indicates an active level, the second pulse signal is output according to the falling edge of the first input signal and the second frequency is changed to a third frequency. In the reception circuit, a first level of a first output signal is changed to a second level according to a first induced signal via a transformer, the second level of the first output signal is changed to the first level according to a second induced signal via the transformer, and a second output signal is changed to an active level when a frequency of the second induced signal has changed to the third frequency.

BRIEF DESCRIPTION OF DRAWINGS

The objects, features, and advantages of the present disclosure will become more apparent from the following detailed description made with reference to the accompanying drawings. In the drawings:

FIG. 14 is a timing chart showing the operation of the magnetic coupler.

DETAILED DESCRIPTION

First Embodiment

Figure 1:
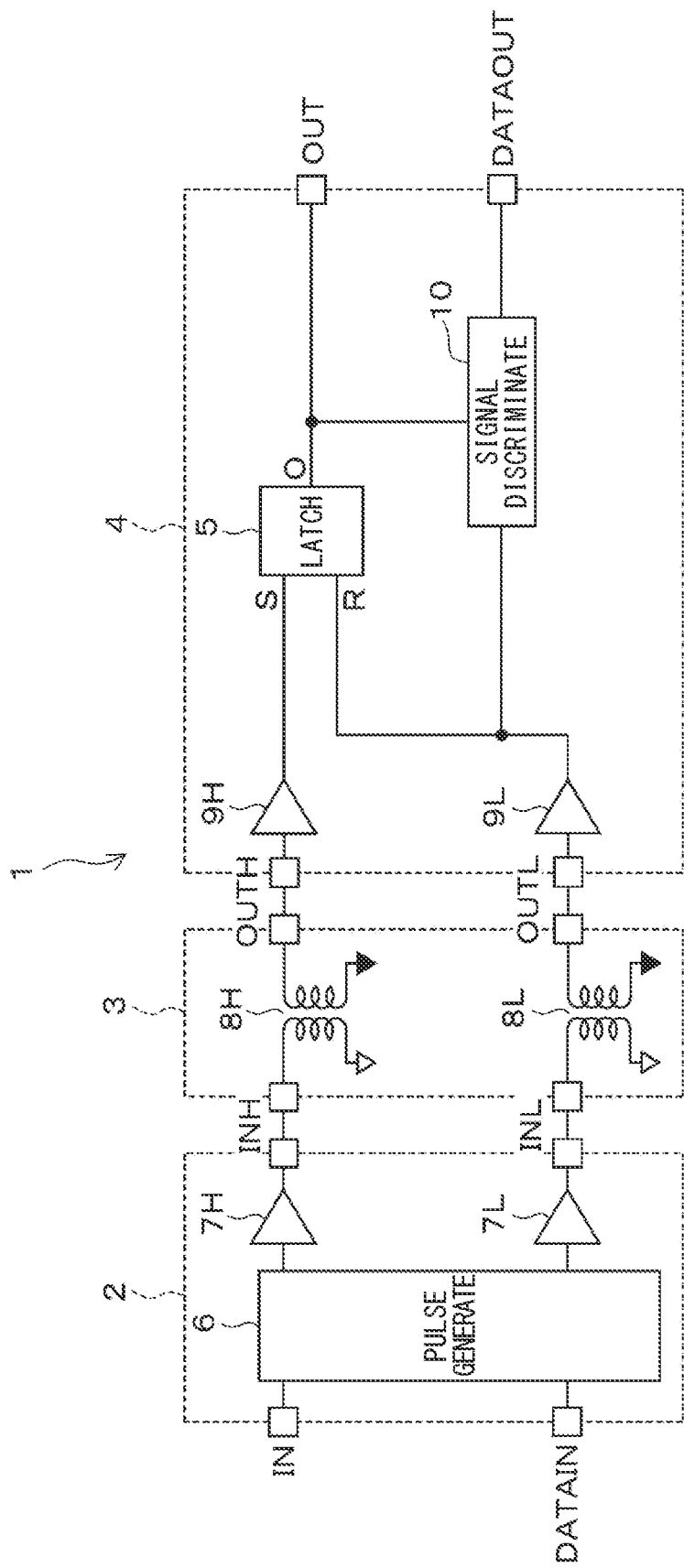
FIG. 1 is a diagram showing a configuration of a magnetic coupler according to a first embodiment.

As shown in FIG. 1, a magnetic coupler 1 which is a signal transmission apparatus includes a transmission side chip 2, a transformer chip 3, and a reception side chip 4. A latch circuit 5 which is an RS flip-flop is formed on the reception side chip 4 as a controlled target circuit in the chip 4. A pulse generation circuit 6 is formed on the transmission side chip 2, and a first input signal IN and a second input signal DATAIN are input from the outside. The transmission side chip 2 corresponds to a transmission circuit, and the reception side chip 4 corresponds to a reception circuit. In all of the signals described below, an active level is high and an inactive level is low.

The pulse generation circuit 6 includes two output terminals. The pulse generation circuit 6 outputs a signal INH to a transformer chip 3 via a transmission buffer 7H during a period of time in which the first signal IN is in a high level. Further, the pulse generation circuit 6 outputs a signal INL to a transformer chip 3 via a transmission buffer 7L during a period of time in which the second signal IN indicates a low level. Both the signals INH and INL are pulse train signals. The pulse generation circuit 6 modulates the frequency of the pulse train signal on the signal INL according to the level of the second signal DATAIN. The signal INH and the signal INL correspond to a first pulse signal and a second pulse signal, respectively.

The transformer chip 3 includes two transformers 8H and 8L as coupling elements. One ends of the primary side winding 6a and the secondary side winding 6b are connected to independent grounds, respectively. Then, the signals OUTH and OUTL are output to the reception side chip 4 from the secondary sides of the transformers 8H and 8L, respectively. The signals OUTH and OUTL are input to a latch circuit 5 via reception buffers 9H and 9L, respectively. The output signal of the reception buffer 9H becomes a set signal of the latch circuit 5, and the output signal of the reception buffer 9L becomes a reset signal of the latch circuit 5. The latch circuit 5 outputs a first output signal OUT to the outside. The signal OUTH and the signal OUTL correspond to a first induced signal and a second induced signal, respectively.

Further, the output signal of the reception buffer 9L and the first output signal OUT are input to a signal discrimination circuit 10. The signal discrimination circuit 10 outputs a second output signal DATAOUT discriminated from the signal OUTL to the outside. The signal OUT is a signal for transmitting a change in status to, for example, a higher-level control circuit. The signal DATAOUT is a signal for driving a switching element such as a MOSFET.

Figure 2:
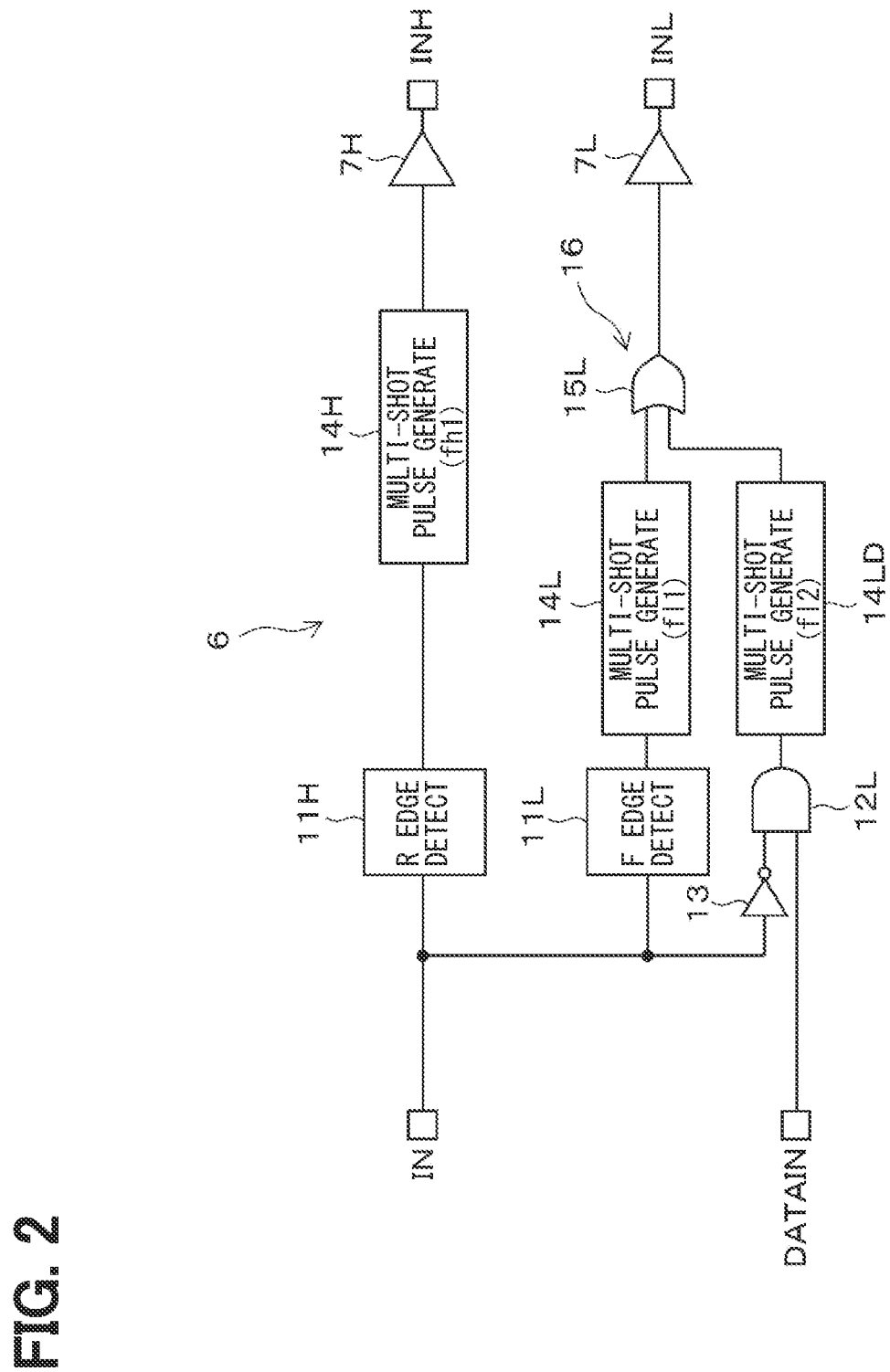
FIG. 2 is a diagram showing a configuration of a pulse generation circuit.

As shown in FIG. 2, the pulse generation circuit 6 includes a rising edge detection unit 11H for detecting a rising edge of the signal IN and a falling edge detection unit 11L for detecting a falling edge of the signal IN. Further, the signal IN is input to one of the input terminals of an AND gate 12L via a NOT gate 13. The signal DATAIN is input to the other of the input terminals of the AND gate 12L.

The output terminals of the rising edge detection unit 11H, the falling edge detection unit 11L, and the AND gate 12L are connected to the trigger terminals of the multi-shot pulse generation circuits 14H, 14L, and 14LD, respectively. When the trigger signal is input, the multi-shot pulse generation circuits 14H, 14L and 14LD output pulse signals having frequencies fh1, fl1, and fl2, respectively, for a fixed period of time. As an example, the frequencies fh1 and fl1 are about 10 MHz, and the frequency fl2 is about several 100 kHz. The frequencies fh1 and fl1 do not necessarily have to be the same frequency. The frequencies fh1, fl1, and fl2 correspond to a first frequency, a second frequency, and a third frequency, respectively.

The output terminal of the multi-shot pulse generation circuit 14H is connected to the input terminal of the transmission buffer 7H. The output terminals of the multi-shot pulse generation circuits 14L and 14LD are connected to the input terminals of the OR gate 15L, respectively. The output terminal of the OR gate 15L is connected to the input terminal of the transmission buffer 7H. The pulse generation circuit 6 is an example of a signal output sub-circuit, or unit. Further, the constitute elements 13, 12L, 14LD and 15L are included in a modulation sub-circuit or unit 16.

Figure 3:
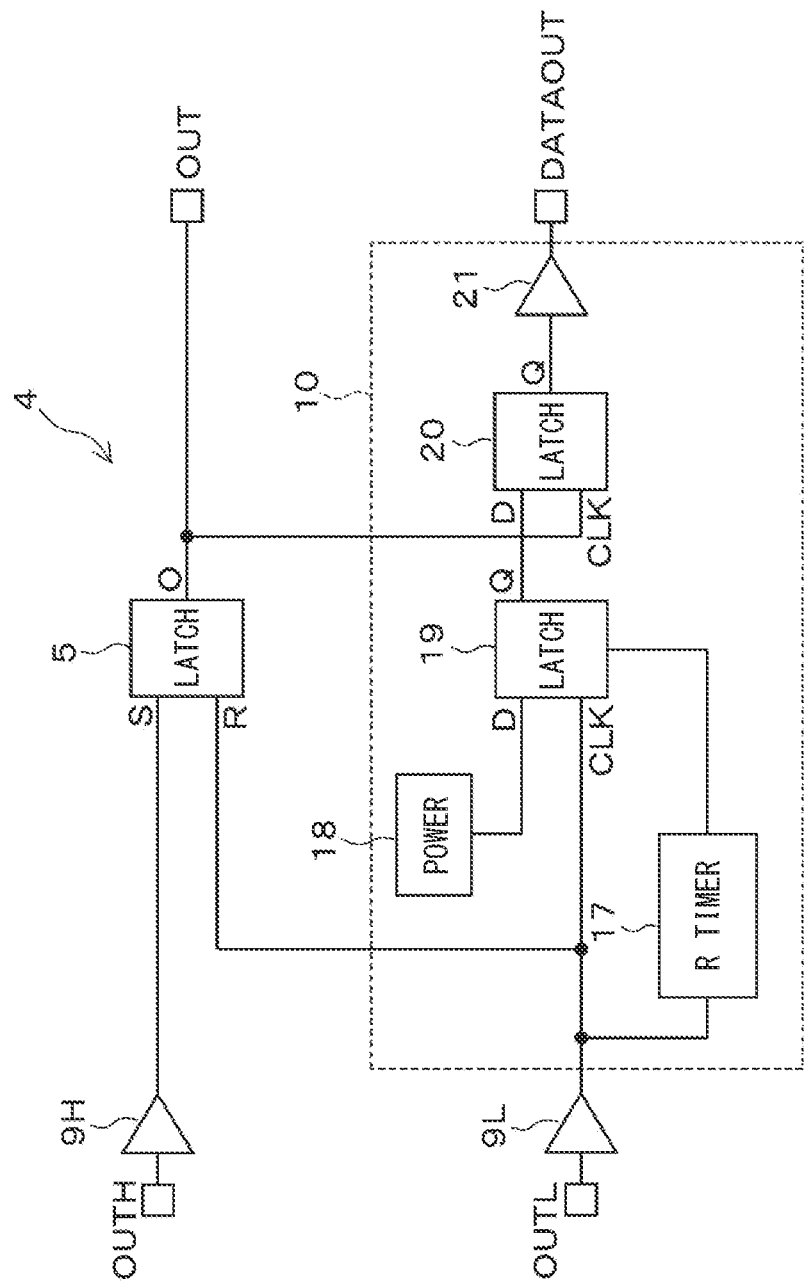
FIG. 3 is a diagram showing a configuration of a signal discrimination circuit.

As shown in FIG. 3, the output terminals of the reception buffers 9H and 9L are connected to the set terminal S and the reset terminal R of the latch circuit 5 which is as RS flip-flop, respectively. Further, the output terminal of the reception buffer 9L is connected to (i) the reset terminal R of a timer 17 included in the signal discrimination circuit 10 and (ii) the clock terminal CLK of the latch circuit 19. The input terminal D of the latch circuit 19 is pulled up to a high level by the power supply 18. The output terminal of the timer 17 is connected to the reset terminal R of the latch circuit 19. The timer 17 resets the latch circuit 19 when it starts measuring and completes measuring a fixed period of time. The above fixed period of time corresponds to a clocked period of time.

The latch circuit 20 is connected in series with the latch circuit 19. The clock terminal CLK of the latch circuit 20 is connected to the output terminal of the latch circuit 5. The signal DATAOUT is output from the output terminal Q of the latch circuit 20 via an output buffer 21. The latch circuits 19 and 20 correspond to a first latch circuit and a second latch circuit, respectively.

Figure 4:
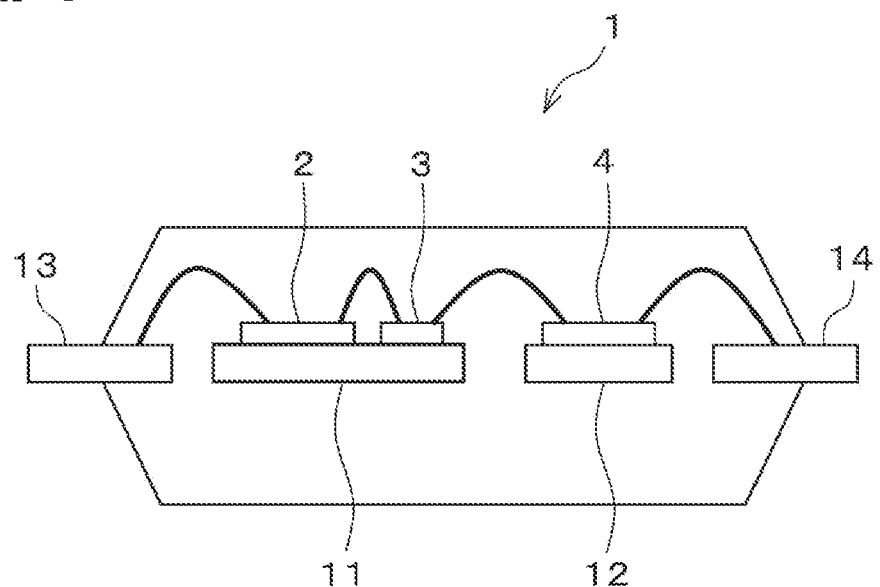
FIG. 4 is a cross-sectional view showing a package of a magnetic coupler.
Figure 5:
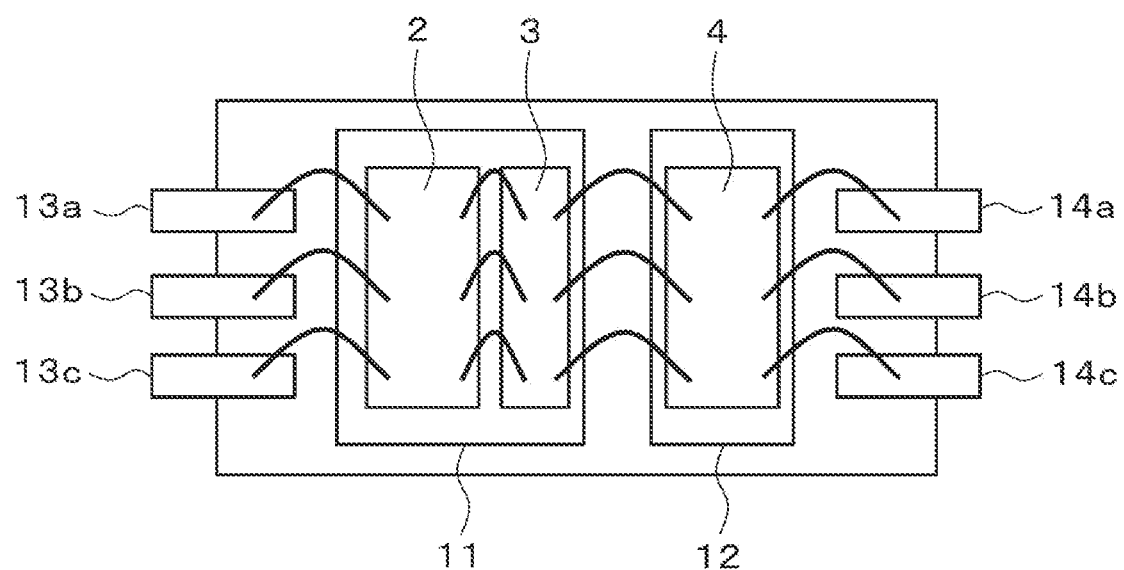
FIG. 5 is a plan view showing the inside of the package of the magnetic coupler.

As shown in FIG. 4 and FIG. 5, for example, the input side chip 2 and the transformer chip 3 are both die-bonded to the lead frame 11, and the output side chip 4 is die-bonded to the lead frame 12. The lead frames 13a to 13c are external terminals on the input side chip 2, and the lead frames 14a to 14c are external terminals on the output side chip 4. Between the chips 2 to 4, between the lead frame 13 and the input side chip 2, and between the output side chip 4 and the lead frame 14, are connected via bonding wires, respectively. The whole is molded by the resin and the magnetic coupler 1 is composed of one package.

Figure 6:
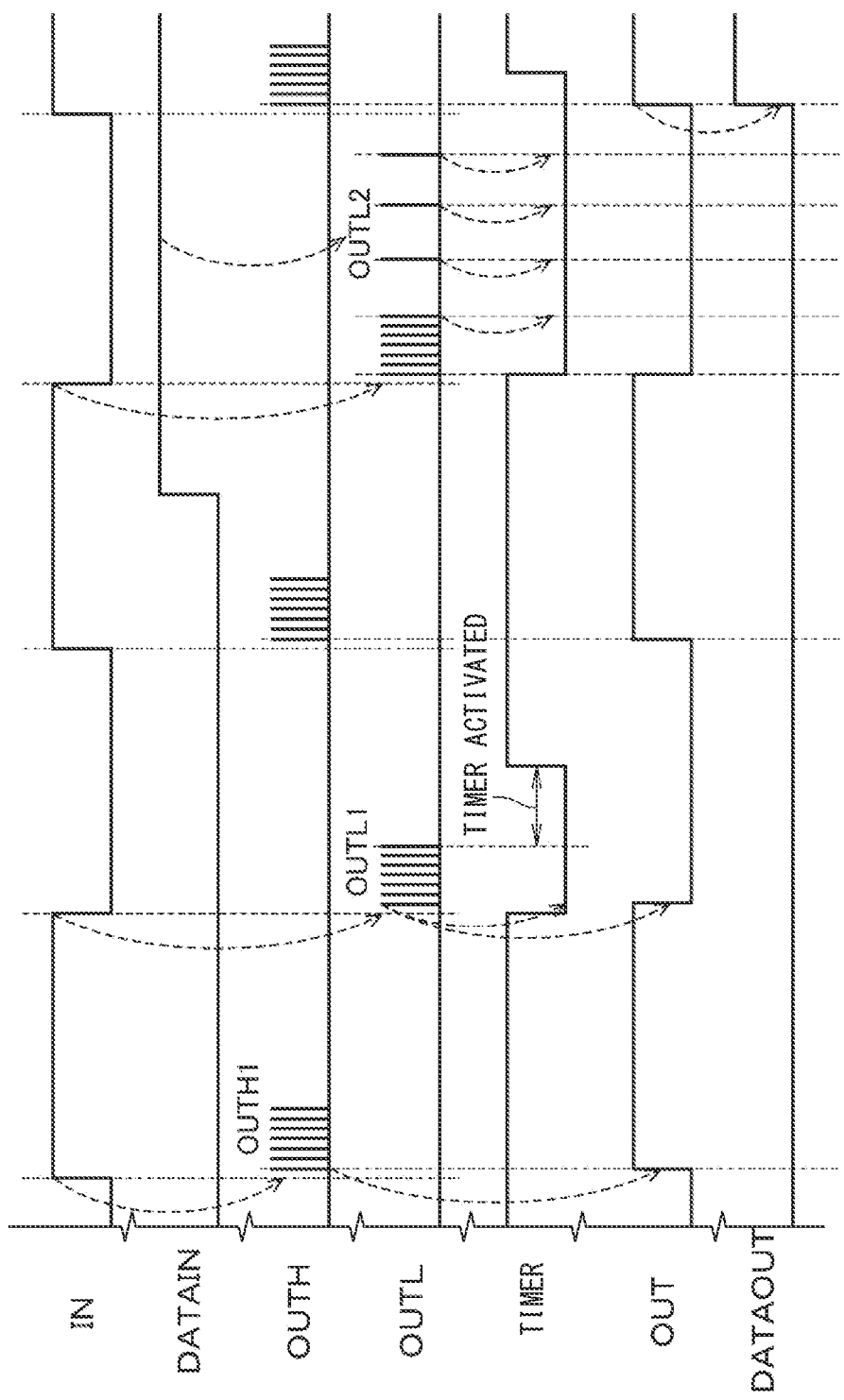
FIG. 6 is a timing chart showing the operation of the magnetic coupler.

Next, the operation of this embodiment will be described. As shown in FIG. 6, during the period of time in which the signal DATAIN indicates a low level, a pulse signal OUTH1 having a frequency fh1 is input to the reception circuit 4 according to the point of time of occurrence of the rising edge at which the binary levels of the signal IN change. A pulse signal OUTL1 having a frequency of fl1 is input according to the point of time of occurrence of the falling edge at which the binary levels of the signal IN change. Since the latch circuit 5 is set by the pulse signal OUTH1 and reset by the pulse signal OUTL1, the level of the signal OUT changes according to the change in the binary levels of the signal IN. The frequency at which the binary levels of the signal IN change is, for example, about 100 kHz. Further, the period of time in which the pulse signals OUTH1 and OUTL1 are output is, for example, about ⅛ of the cycle of the signal IN.

The latch circuit 19 of the signal discrimination circuit 10 is triggered by the pulse signal OUTL1, and the timer 17 is reset by the pulse signal OUTL1. The fixed period of time measured by the timer 17 is set to, for example, about 1.5 times the cycle corresponding to the frequency fl2. Therefore, after the last pulse of the pulse signal OUTL1 is input, the timer 17 completes measuring the fixed period of time earlier than the point of time when the rising edge of the signal IN occurs next, so that the latch circuit 19 is reset. As a result, even if the rising edge occurs to trigger the latch circuit 20, the signal DATAOUT remains at a low level.

Then, when the signal DATAIN changes to a high level, the pulse signal OUTL2 having a frequency of fl1 is input according to the point of time of occurrence of the falling edge, and then the pulse signal OUTL2 having a changed frequency of fl2, which is lower than fl1, is input. The timer 17 continues to be reset by the pulse signal OUTL2 at intervals faster than measuring a fixed period of time. Then, at the point of time of next occurrence of the rising edge of the signal IN after the last pulse of the pulse signal OUTL2 is input, the period of time measured by the timer 17 does not reach the fixed period of time. As a result, the latch circuit 20 is triggered while the latch circuit 19 is set, so that the signal DATAOUT changes to a high level.

As described above, according to the present embodiment, when the signal IN input from the outside indicates a high level, the pulse generation circuit 6 of the transmission side chip 2 outputs a pulse train having a frequency fh1 as a signal INH for a fixed period of time. In contrast, when the signal IN indicates a low level, the pulse generation circuit 6 outputs a pulse train having a frequency of fl1 as a signal INL for a fixed period of time.

The signals INH and INL are received by the reception side chip 4 as signals OUTH and OUTL via the transformer chip 3, the latch circuit 5 is controlled by these signals, and the signal OUT is output to the outside. Then, the signal DATAIN indicates an active level. In this case, when the signal IN changes to a low level, the modulation sub-circuit 16 of the transmission side chip 2 outputs the signal INL as a pulse train with the frequency of fl1 for a fixed period of time and then changes the frequency from fl1 to fl2. Then, the signal discrimination circuit 10 of the reception side chip 4 changes the signal DATAOUT from a low level to a high level. Further, the transmission side chip 2, the transformer chip 3 and the reception side chip 4 are configured in one package.

With this configuration, the signals INH and INL output from the transmission side chip 2 become signals with a pulse train. Therefore, the latch circuit 5 of the reception side chip 4 can be stably controlled by each pulse train signal according to the level change of the signal IN, and the demodulated signal DATAOUT can be output to the outside for other control. Therefore, the robustness is improved, and the control using the second signal DATAOUT can be performed without increasing the circuit configuration as much as possible.

The latch circuit 19 of the reception side chip 4 is triggered by the signal OUTL to output an active level signal. The latch circuit 20 connected with the latch circuit 19 in series is triggered based on the set signal level of the latch circuit 5 to output the signal DATAOUT. The timer 17 is reset by the signal OUTL. The timer 17 resets the latch circuit 19 when completing measuring a fixed period of time that is set to 1.5 times the cycle of the frequency of fl2.

With this configuration, during the period of time in which the signal DATAIN indicates an inactive level, even if the signal INL input is stopped, the timer 17 completes measuring a fixed period of time before the next signal INH is input. Therefore, the latch circuit 19 is reset. Therefore, the signal DATAOUT indicates a low level. On the other hand, when the signal DATAIN indicates an active level, the signal INL changes to fl2.

Then, the time from the input of the last pulse of the signal INL to the input of the first pulse of the next signal INH is equal to or longer than the cycle of the frequency fl2. Therefore, the latch circuit 19 is not reset, the latch circuit 20 is triggered based on the set signal level of the latch circuit 5, and the signal DATAOUT changes to a high level. The signal discrimination circuit 10 of the reception side chip 4 can be configured as above.

Second Embodiment

Figure 7:
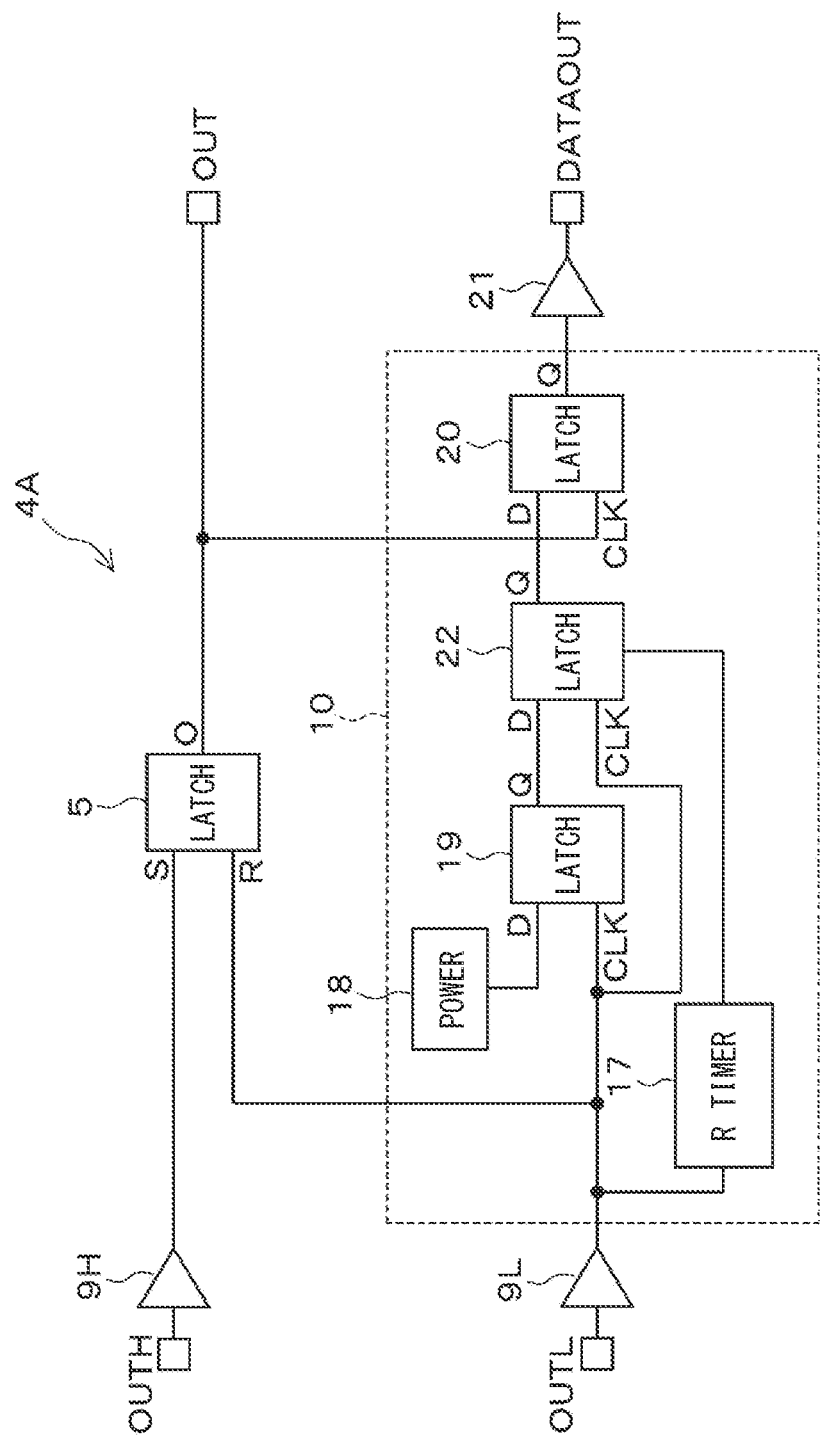
FIG. 7 is a diagram showing a configuration of a signal discrimination circuit according to a second embodiment.

Hereinafter, the same parts as those in the first embodiment are designated by the same reference signs, description thereof will be omitted, and different parts will be described. As shown in FIG. 7, the reception side chip 4A of a second embodiment has a configuration in which the latch circuit 22 is added between the latch circuits 19 and 20. Like the latch circuit 19, the latch circuit 22 is triggered by the signal OUTL and reset by the timer 17.

According to the second embodiment configured as described above, the signal DATAOUT changes to a high level by outputting the pulse of the signal OUTL twice in succession. Therefore, the robustness can be further improved.

Third Embodiment

Figure 8:
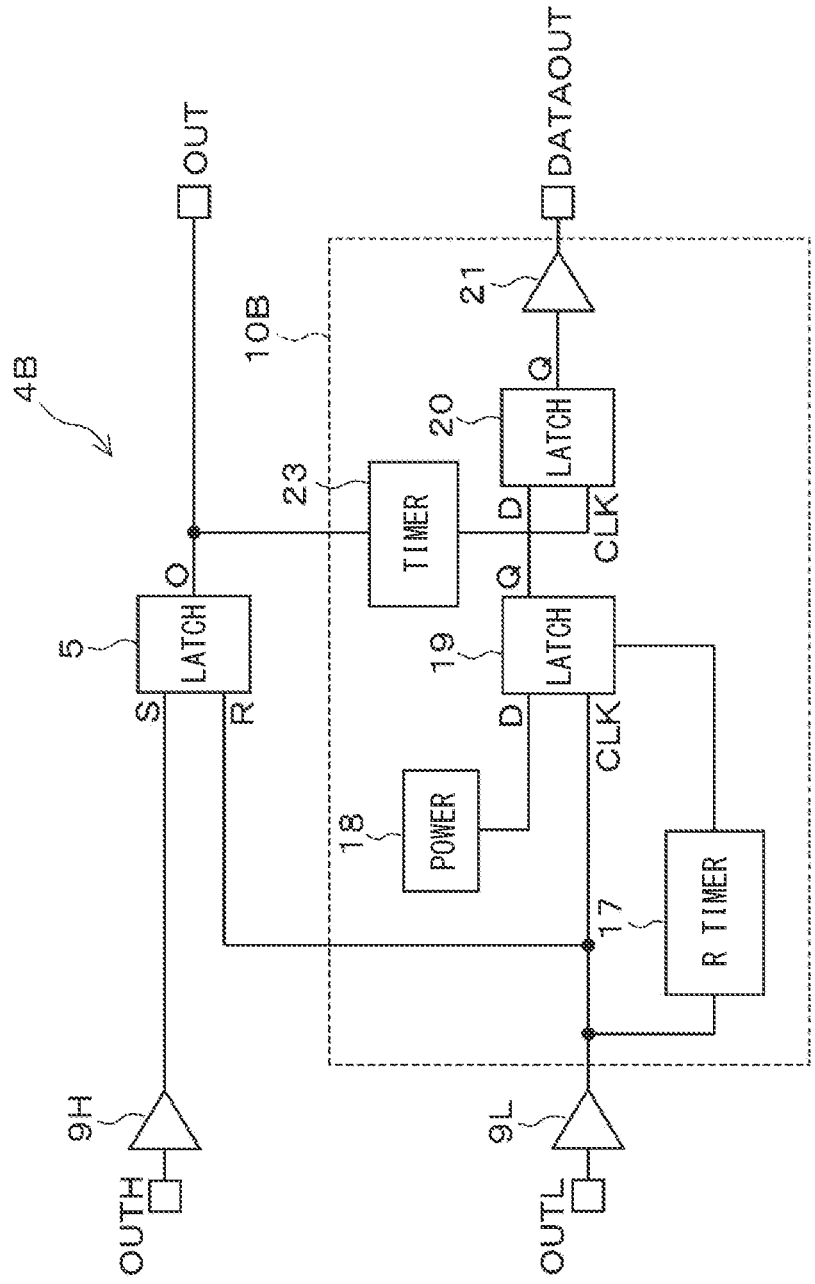
FIG. 8 is a diagram showing a configuration of a signal discrimination circuit according to a third embodiment.

As shown in FIG. 8, the reception side chip 4B according to a third embodiment has a configuration in which a timer 23 is inserted between the output terminal O of the latch circuit 5 and the clock terminal CLK of the latch circuit 20. As a result, the point of time at which the signal DATA OUT changes to a high level can be delayed from the point of time at which the signal OUT changes to a high level. In this case, the period of time from when the timer 23 is started by the signal OUT to when the timer 23 triggers the latch circuit 20 is set shorter than a clocked period of time of the timer 17.

Fourth Embodiment

Figure 9:
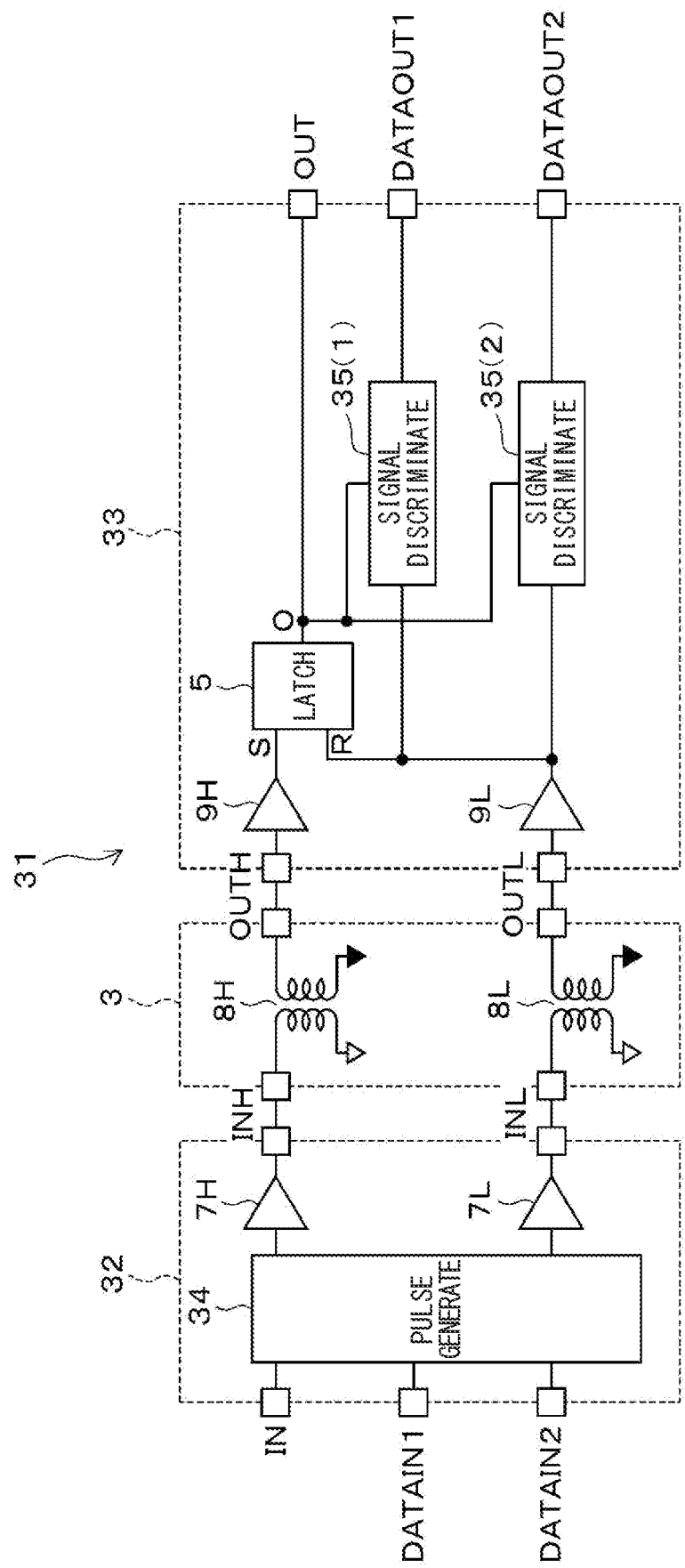
FIG. 9 is a diagram showing a configuration of a magnetic coupler according to a fourth embodiment.

As shown in FIG. 9, the magnetic coupler 31 of a fourth embodiment includes a transmission side chip 32, a transformer chip 3, and a reception side chip 33. The transmission side chip 32 includes a pulse generation circuit 34; a reception side chip 33 includes signal discrimination circuits 35(1) and 35(2). The signal DATAIN1 is input to the transmission side chip 32 as a second input signal, and the signal DATAIN2 is input as a third input signal. Then, the pulse generation circuit 34 changes the frequency of the signal INL from fl1 to fl2 in accordance with the level change in the signal DATAIN1 as in the first embodiment. Further, the pulse generation circuit 34 changes the amplitude of the signal INL from H1 to a larger amplitude H2 according to the level change in the signal DATAIN2.

Figure 10:
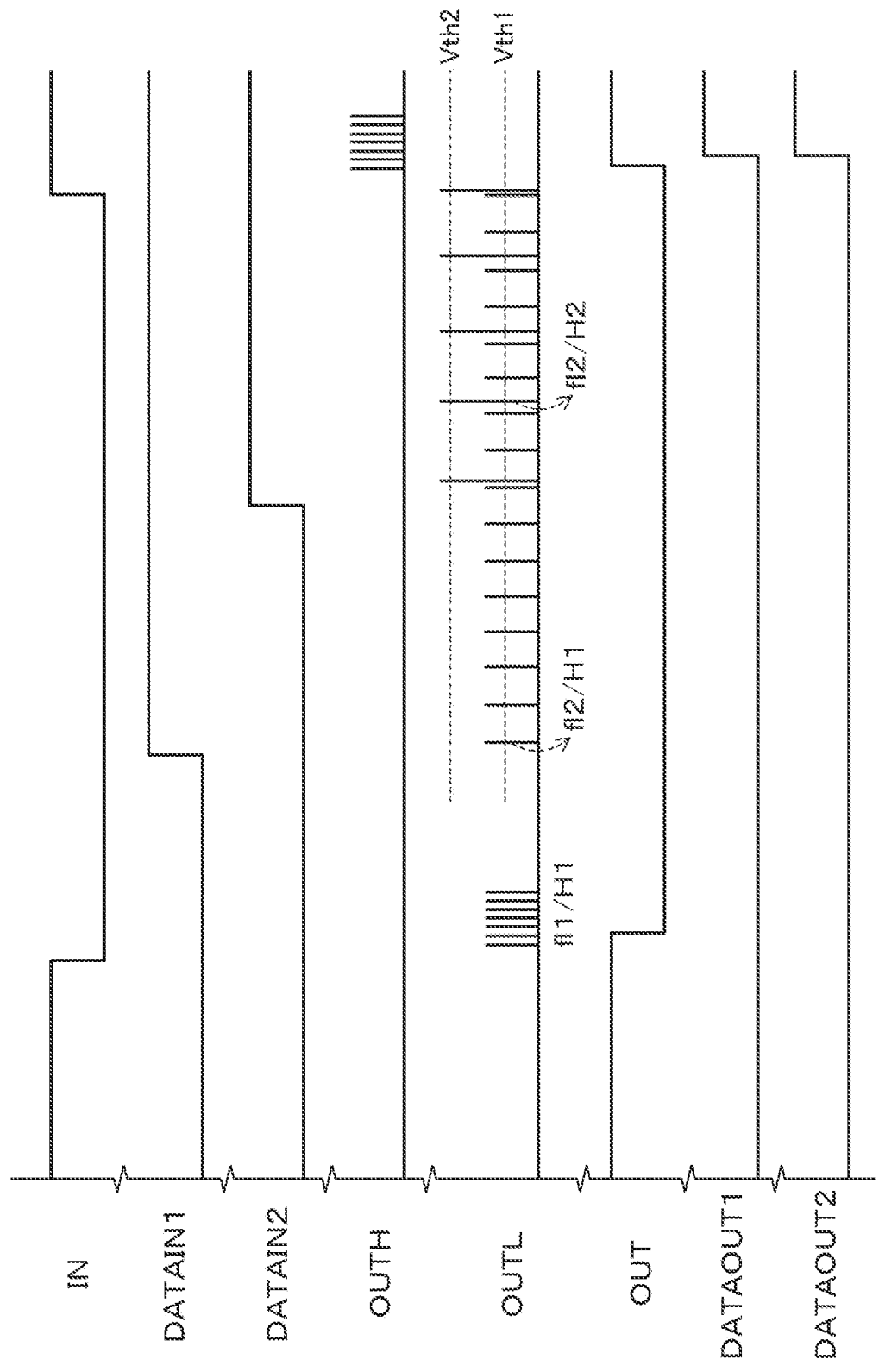
FIG. 10 is a timing chart showing the operation of the magnetic coupler.

As shown in FIG. 10, the signal discrimination circuit 35(1) changes the signal DATAOUT1 to a high level in synchronization with the rising edge of the signal OUT, on condition of detecting that (I) the frequency of the signal INL has changed from fl1 to fl2 as in the first embodiment, and (ii) the amplitude of the signal INL is H1 using the threshold values Vth1 and Vth2. Further, similarly, the signal discrimination circuit 35(2) changes the signal DATAOUT2 to a high level in synchronization with the rising edge of the signal OUT, on condition of detecting that (I) the frequency of the signal INL has changed from fl1 to fl2 as in the first embodiment, and (ii) the amplitude of the signal INL is H2 using the threshold value Vth2.

As described above, according to the fourth embodiment, the pulse generation circuit 34 changes the amplitude of the signal INL when the signal DATAIN2 indicates a high level. When the signal discrimination circuit 35(2) detects that the frequency of the signal INL has changed to fl2 and the amplitude of the signal has changed to H2, the signal DATAOUT2 is changed to a high level. As a result, control can be performed using three types of input/output signals.

Fifth Embodiment

Figure 11:
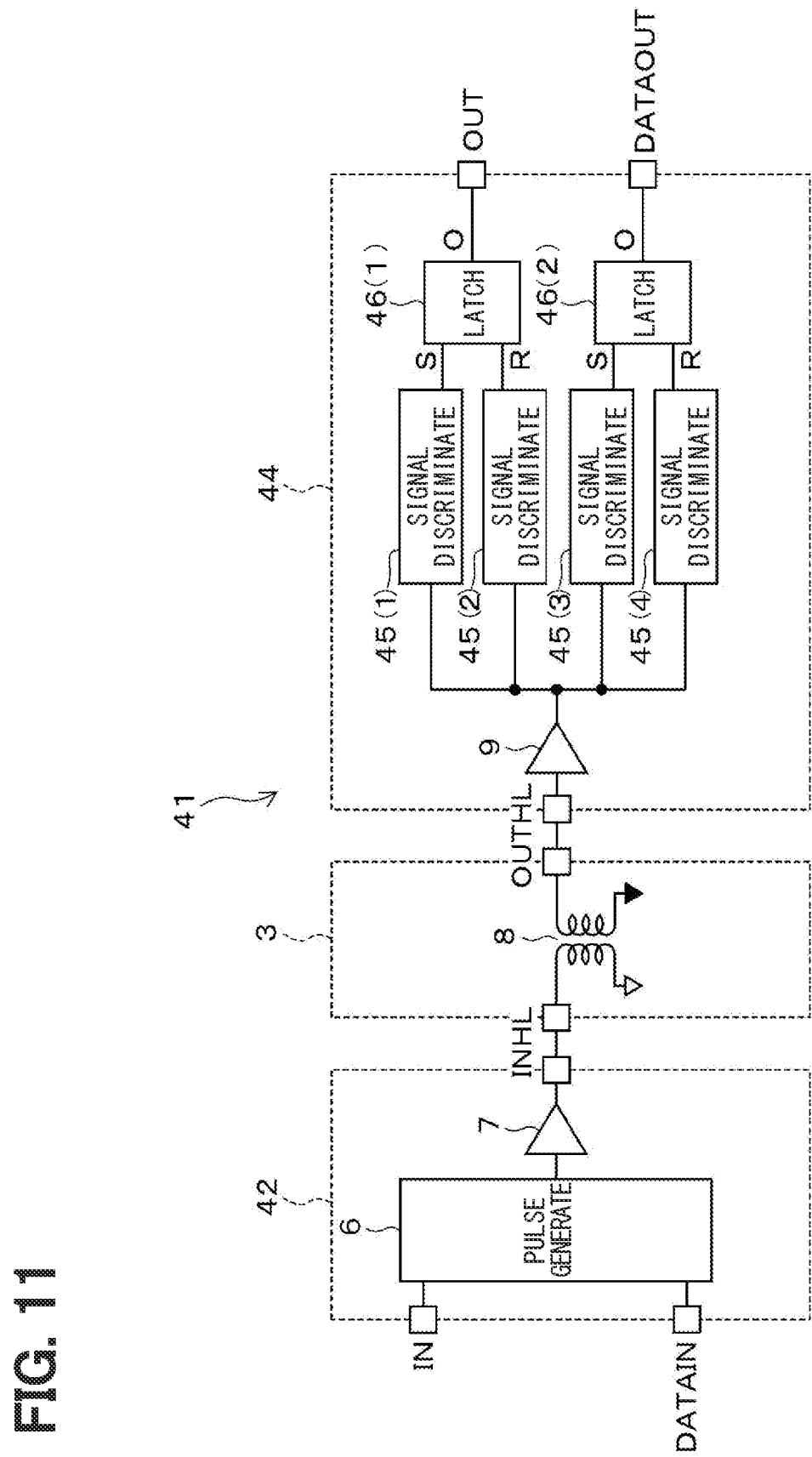
FIG. 11 is a diagram showing a configuration of a magnetic coupler according to a fifth embodiment.

As shown in FIG. 11, the magnetic coupler 41 of a fifth embodiment includes a transmission side chip 42, a transformer chip 43, and a reception side chip 44. The transmission side chip 42 includes a pulse generation circuit 45; the transformer chip 43 includes a single transformer 8. The reception side chip 44 includes four signal discrimination circuits 45(1) to 45(4).

Figure 12:
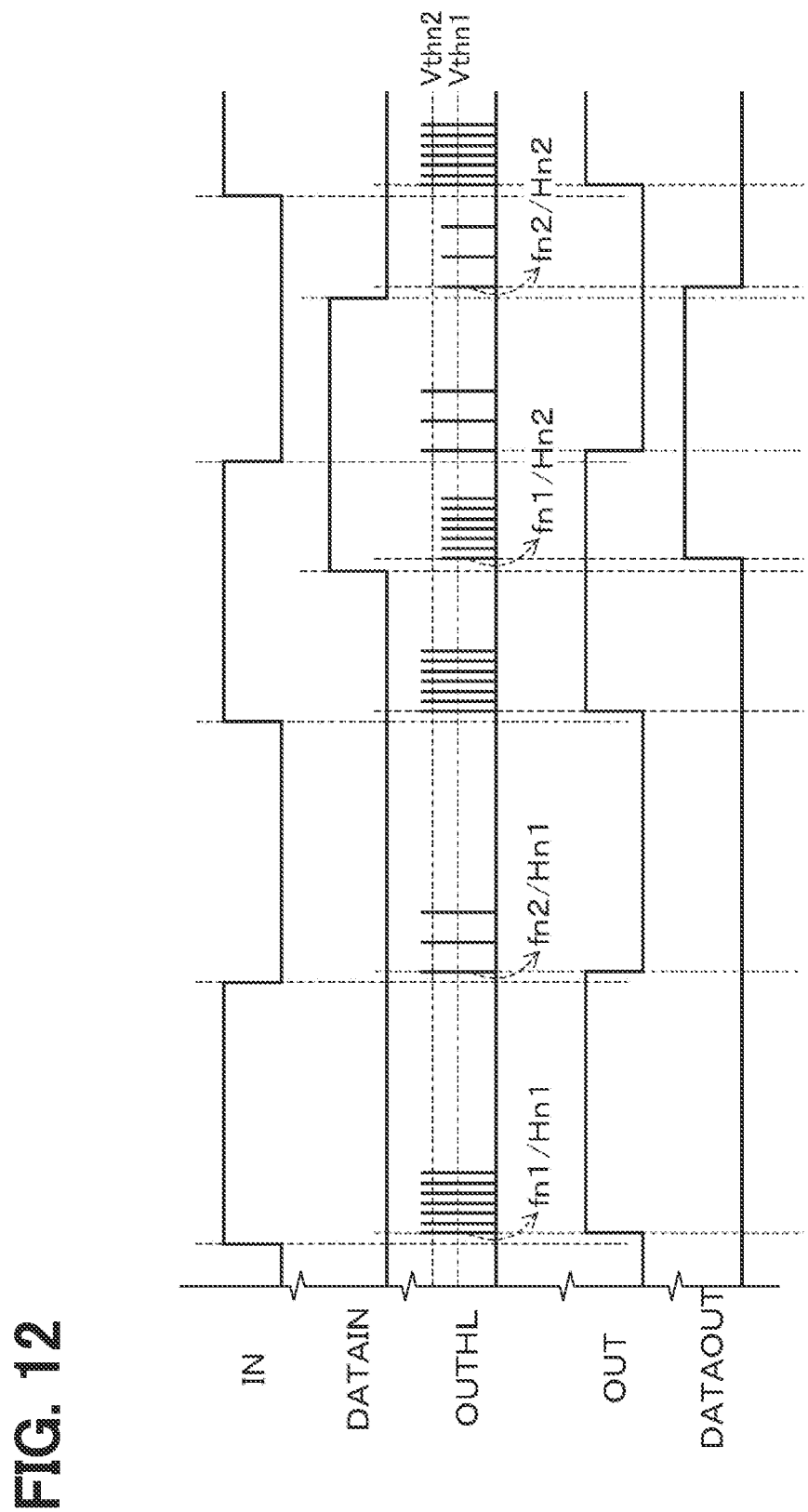
FIG. 12 is a timing chart showing the operation of the magnetic coupler.

Signal IN and signal DATAIN are input to the transmission side chip 42 as in the first embodiment. As shown in FIG. 12, the pulse generation circuit 45 changes the frequency and amplitude of the signal INHL in the following four combinations according to the level change of the signal IN and signal DATAIN. Note that "R" indicates a rising edge, and "F" indicates a falling edge.

| IN | DATAIN | INHL |
|----|--------|------|
| R  | —      | Frequency fn1/Amplitude Hn1 (Condition 1) |
| F  | —      | Frequency fn2/Amplitude Hn1 (Condition 2) |
| —  | R      | Frequency fn1/Amplitude Hn2 (condition 3) |
| —  | F      | Frequency fn2/Amplitude Hn2 (condition 4) |

The frequency fn1>fn2 and the amplitude Hn1>Hn2.
The amplitudes Hn1 and Hn2 are determined by using the threshold values Vthn1 and Vthn2.

Then, when the signal discrimination circuit 45(1) detects the above condition 1 for the signal OUTHL, the signal discrimination circuit 45(1) sets the latch circuit 46 (1). When the signal discrimination circuit 45(2) detects the above condition 2 for the signal, the signal discrimination circuit 45(2) resets the latch circuit 46(1). When the signal discrimination circuit 45(3) detects the above condition 3 for the signal, the signal discrimination circuit 45(3) sets the latch circuit 46(2). When the signal discrimination circuit 45(4) detects the above condition 4 for the signal, the signal discrimination circuit 45 (4) resets the latch circuit 46(2).

As described above, according to the fifth embodiment, the pulse generation circuit 45 of the transmission side chip 42 outputs the pulse signal INHL having the frequency fn1 and the amplitude Hn1 according to the rising edge where the binary levels of the signal IN change, and changes the frequency of the signal INHL to fn2 according to the falling edge. Further, the pulse generation circuit 45 of the transmission side chip 42 outputs the signal INHL having the frequency fn1 and the amplitude Hn2 according to the rising edge where the binary levels of the signal DATAIN change, and changes the frequency of the signal INHL to fn2 according to the falling edge. The signal INHL becomes an induced signal OUTHL via the transformer 8 and is transmitted to the reception side chip 44.

Then, the signal discrimination circuits 45(1) to 45(4) of the reception side chip 44 set and resets the latch circuits 46(1) and 46(2) by detecting the above conditions 1 to 4 for the induced signal OUTHL, to thereby change the level of the signal OUT and DATAOUT. With this configuration, the same effect as that of the magnetic coupler 1 of the first embodiment can be obtained by the configuration using one transformer 8.

Sixth Embodiment

Figure 13:
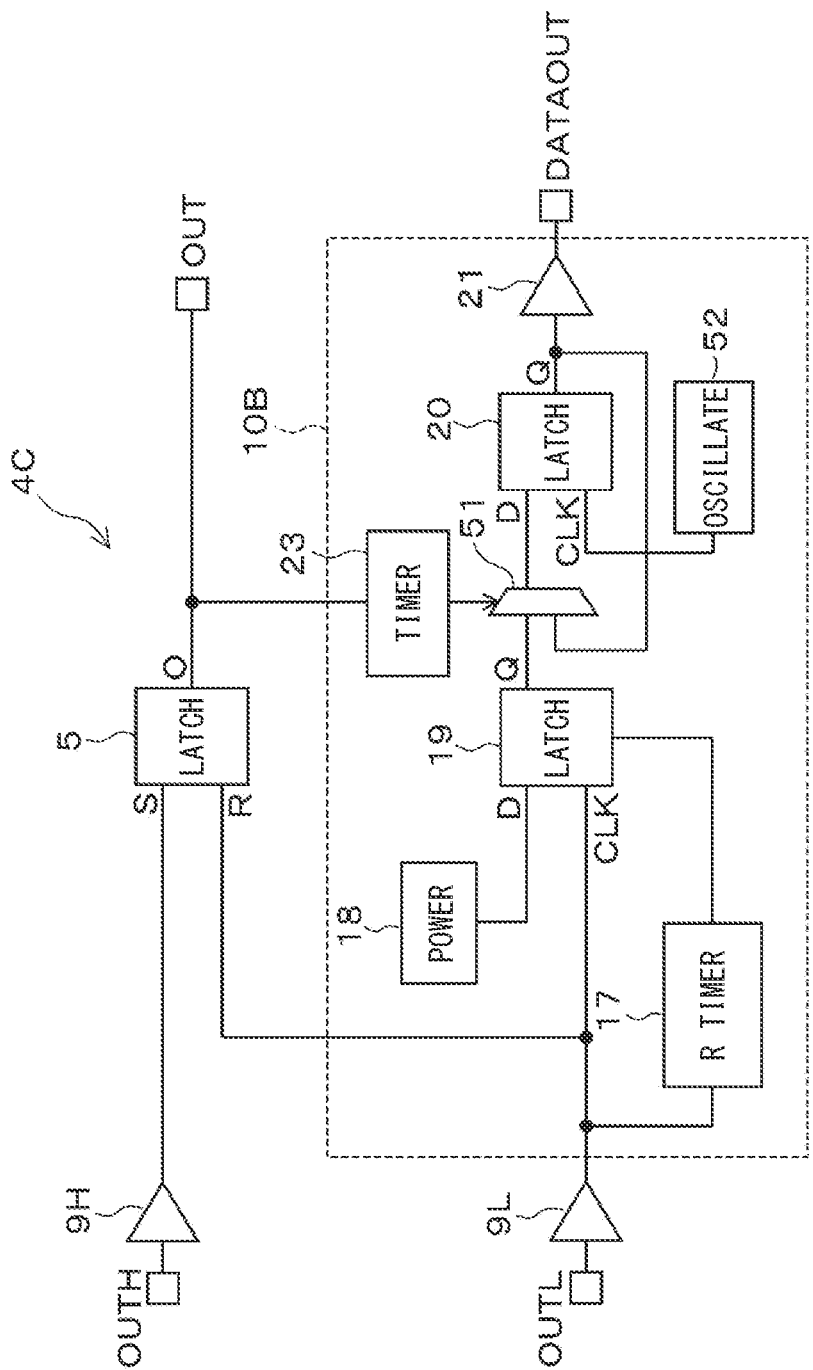
FIG. 13 is a diagram showing a configuration of a signal discrimination circuit according to a sixth embodiment.

As shown in FIG. 13, the reception side chip 4C of a sixth embodiment has a configuration in which the reception side chip 4B of the third embodiment is slightly modified. A selector 51 is arranged between the latch circuits 19 and 20, and the selector 51 selects one of the output terminals Q of the latch circuits 19 and 20 and inputs the input signal to the input terminal D of the latch circuit 20. The selection switching of the selector 51 is controlled by the output signal of the timer 23. The timer 23 starts measuring when the output signal OUT becomes a low level. The clocked period of time T23 of the timer 23 is set to be longer than the cycle of the frequency fl2.

The selector 51 selects the output terminal Q of the latch circuit 20 during the period of time in which the output signal of the timer 23 indicates a low level. In contrast, the selector 51 selects the output terminal Q of the latch circuit 19 when (i) the timer 23 starts measuring and then completes measuring (i.e., timing) the clocked period of time T23, and (ii) the output signal thereby becomes a high level. The latch circuit 20 is triggered by a clock signal output by an oscillator 52. The cycle of the clock signal is set to be longer than, for example, the cycle of the frequency fl1 and shorter than the cycle of frequency fl2. The timers 17 and 23 correspond to a first timer and a second timer, respectively.

Next, the operation of the sixth embodiment will be described. As shown in FIG. 14, it is assumed that the signal DATAIN changes to a high level twice after the signal IN changes from a high level to a low level. Since the selector 51 selects the output terminal Q of the latch circuit 20 during the period of time in which the output signal of the timer 23 indicates a low level, the output signal DATAOUT indicates a low level. When the level of the output signal OUT changes from high to low, the timer 23 is activated.

As the level of the signal DATAIN changes from low to high, the signal input to the terminal OUTL changes from OUTL1 to OUTL2. As a result, the latch circuit 19 is triggered and the output terminal Q becomes a high level. When the timer 23 completes measuring the period of time T23, the selector 51 selects the output terminal Q of the latch circuit 19. After that, when the latch circuit 20 is triggered by the clock signal of the oscillator 52, the output signal DATAOUT becomes a high level. That is, the output signal DATAOUT becomes a high level when the clocked period of time T23 plus one cycle of the clock signal has elapsed after the output signal OUT changes to a low level.

When the level of the signal DATAIN changes from high to low, the output of the signal OUTL2 is stopped, so that the timer 17 is started. When the timer 17 completes measuring the period of time T17, the latch circuit 19 is reset and the output terminal Q becomes a low level. The clock signal output thereafter triggers the latch circuit 20 to bring the output signal DATAOUT to a low level.

When the signal DATAIN becomes a high level again during the period of time in which the signal IN indicates a low level, the latch circuit 19 is triggered by the signal OUTL2 and the output terminal Q becomes a high level. When the latch circuit 20 is triggered by the clock signal of the oscillator 52, the output signal DATAOUT becomes a high level again. When the signal DATAIN becomes a low level, the timer 17 starts measuring. Here, before the timer 17 completes measuring the period of time T17, the signal IN becomes a high level and the output signal OUT becomes a high level. As a result, the selector 51 selects the latch circuit 20 side, so that the output signal DATAOUT is fixed at a high level.

As described above, according to the sixth embodiment, the latch circuit 20 is triggered by the clock signal having a cycle shorter than the cycle of the frequency fl2, and outputs the output signal DATAOUT. The selector 51 selects one of the output signals of the latch circuits 19 and 20. The timer 23 is activated by the reset signal level of the RS flip-flop 5. When the clocked period of time T23 elapses, the selection state of the selector 51 is switched from the output signal of the latch circuit 19 to the output signal of the latch circuit 20. With this configuration, the point of time at which the output signal DATAOUT is output can be controlled by the clocked period of time T23 of the timer 23.

Other Embodiments

The controlled target circuit is not limited to the latch circuit 5, and may be any circuit controlled by two signals. The configurations of the second to sixth embodiments may be configured in one package as in the first embodiment. Further, it is not always necessary to configure it in one package, and it may be configured in a multi-package. Although the present disclosure has been described in accordance with the embodiments, it is understood that the present disclosure is not limited to the embodiments and structures. The present disclosure incorporates various modifications and variations within the scope of equivalents. In addition, various combinations and forms, and further, other combinations and forms including only one element, or more or less than these elements are also within the sprit and the scope of the present disclosure.

For reference to further explain features of the present disclosure, the description is added as follows.

For example, there is disclosed a signal transmission apparatus as follows. On the transmission side, according to a change in the binary levels of an input signal, a flip-flop set signal and a flip-flop reset signal are generated in pulse signals in N times and separately outputted into two signal path systems. The pulse signals are transmitted via two transformers, respectively. On the reception side, when the pulse signals are each received M (<N) times, a set signal and a reset signal are given to the flip-flop.

In the above configuration, two signal path systems are used to set/reset the flip-flop. In contrast, the present disclosure provides a signal transmission apparatus capable of transmitting data for use in a different control without increasing the number of signal path systems to three or more.

Aspects of the present disclosure described herein are set forth in the following clauses.

According to a first aspect of the present disclosure, a signal transmission apparatus is provided to include a transmission circuit including a signal output sub-circuit and a modulation sub-circuit, a first and second transformers, and a reception circuit. The signal output sub-circuit is configured to output a first pulse signal with a first frequency for a first fixed period of time according to a first pulse edge at which a first input signal changes from a first level of binary levels to a second level of binary levels, and output a second pulse signal with a second frequency for a second fixed period of time according to a second pulse edge at which the first input signal changes from the second level of binary levels to the first level of binary levels. T In response to a second input signal indicating an active level, the modulation sub-circuit is configured to output the second pulse signal for a third fixed period of time according to the second pulse edge at which the first input signal changes from the second level of binary levels to the first level of binary levels and then change a frequency of the second pulse signal to a third frequency. The first transformer and the second transformer are configured to receive the first pulse signal and the second pulse signal and output a first induced signal and a second induced signal, respectively, to a reception circuit.

The reception circuit is configured to change a first level of binary levels of a first output signal to a second level of binary levels of the first output signal according to the first induced signal, change the second level of binary levels of the first output signal to the first level of binary levels of the first output signal according to the second induced signal, and change a second output signal to an active level in response to detecting that a frequency of the second induced signal has changed to the third frequency.

With this configuration, the first and second induced signals, which are pulse train signals, are input to the reception circuit according to the level change of the first input signal that is input to the transmission circuit, and, along with this, the binary levels of the first output signal change. Therefore, the first output signal can be output to stably control a target circuit; the second output signal can be output to the outside for other control. Therefore, control using the first and second output signals can be performed without increasing the circuit configuration as much as possible.

According to a first optional aspect of the first aspect of the present disclosure, the modulation sub-circuit in the transmission circuit is further configured to set the third frequency to a value lower than each of the first frequency and the second frequency. The reception circuit includes an RS flip-flop, a first latch circuit, a second latch circuit, and a timer. The RS flip-flop is configured to be set by the first induced signal and reset by the second induced signal to change the binary levels of the first output signal. The first latch circuit is configured to be triggered by the second induced signal and output an active level signal. The second latch circuit is connected in series with the first latch circuit and configured to be triggered based on a set signal level of the RS flip-flop to output the second output signal. The timer is configured to be reset by the second induced signal and reset the first latch in response to a clocked period of time has elapsed, the clocked period of time being set shorter than a period of time in which the binary levels of the first output signal changes and longer than a cycle of the third frequency.

With this configuration, during the period of time in which the second input signal shows the inactive level, the timer completes measuring (i.e., timing) the above clocked period of time before the first induced signal is next input even if the input of the second induced signal is stopped. Therefore, the first latch circuit is reset. Therefore, the second output signal is not output.

In contrast, when the second input signal shows an active level, the frequency of the second induced signal changes to a lower third frequency. Then, for a duration from the input of the last pulse of the second induced signal to the input of the first pulse of the first induced signal, the timer cannot complete measuring the clocked period of time. Therefore, the first latch circuit is not reset, and the second latch circuit is triggered based on the set signal level of the RS flip-flop to output the second output signal. In this way, the reception circuit can be configured.

According to a second optional aspect of the first aspect of the present disclosure, the modulation sub-circuit, the RS flip-flop, and the first latch circuit are configured in the same manner as in the first optional aspect. Further, a second latch circuit, a selector, and a second timer are configured. The second latch circuit is connected in series with the first latch circuit; the second latch circuit is configured to be triggered by a clock signal with a cycle that is shorter than a cycle of the third frequency to output the second output signal. The first timer resets the first latch circuit in the same manner as the first optional aspect. The selector is configured to select either an output signal of the first latch circuit or an output signal of the second latch circuit to output the second output signal. The second timer is configured to be activated by a reset signal level of the RS flip-flop. The second timer switches a selection state of the selector from the output signal of the second latch circuit to the output signal of the first latch circuit in response to a clocked period of time having elapsed, the clocked period of time being set longer than a cycle of the first frequency.

With this configuration, the second output signal is not output during the period of time in which the second input signal indicates the inactive level, as in the first optional aspect. In contrast, when the second input signal shows an active level, the frequency of the second induced signal also changes to the third frequency. Then, the first latch circuit is not reset during the period of time from the input of the last pulse of the second induced signal to the input of the first pulse of the first induced signal.

Since the selector selects the output signal of the second latch circuit in the initial state, the level of the second output signal becomes the reset signal level of the first latch circuit. When the second timer is activated by the reset signal level of the RS flip-flop and the clocked period of time elapses, the selector selects the output signal of the first latch circuit. As a result, the following takes place. That is, as the second input signal indicates the active level, the second induced signal triggers the first latch circuit. Then, the second timer starts to time the clocked period of time based on the time when the first output signal changes to the inactive level. When the clocked period of time has elapsed and the second latch circuit is triggered by the clock signal, the second output signal is output. Therefore, the point of time at which the second output signal is output can be controlled by the clocked period of time of the second timer. The first to third frequencies do not have to be the same values as the first to third frequencies in the first optional aspect.

According to a third optional aspect of the first aspect of the present disclosure, the following is provided. That is, in response to a third input signal input from an outside showing an active level, the modulation sub-circuit in the transmission circuit changes an amplitude of the second pulse signal. Further, in response to detecting that a frequency of the second induced signal changes to a third frequency and an amplitude of the second induced signal changes, the reception circuit changes the third output signal to an active level. As a result, control can be performed using three types of input/output signals.

According to a second aspect of the present disclosure, a signal transmission apparatus is provided to include a transmission circuit, a transformer, and a reception circuit. The transmission circuit is configured to output a pulse signal with a first frequency and a first amplitude value for a first fixed period of time according to a pulse edge at which a first input signal input from an outside changes from a first level of binary levels to a second level of binary levels, and change a frequency of the pulse signal to a second frequency according to a pulse edge at which the first input signal changes from the second level of binary levels to the first level of binary levels. The transmission circuit is further configured to output the pulse signal with the first frequency and a second amplitude value according to a pulse edge at which a second input signal input from an outside changes from a first level of binary levels to a second level of binary levels, and change the frequency of the pulse signal to the second frequency according to a pulse edge at which the second input signal changes from the second level of binary levels to the first level of binary levels. The transformer is configured to receive the pulse signal and output an induced signal to a reception circuit.

The reception circuit is configured to change a first level of binary levels of a first output signal to a second level of binary levels of the first output signal in response to the induced signal having the first frequency and the first amplitude value, and change the second level of binary levels of the first output signal to the first level of binary levels of the first output signal in response to the induced signal having the second frequency and the first amplitude value. The reception circuit is further configured to change a first level of binary levels of a second output signal to a second level of binary levels of the second output signal in response to the induced signal having the first frequency and the second amplitude value, and change the second level of binary levels of the second output signal to the first level of binary levels of the second output signal in response to the induced signal having the second frequency and the second amplitude value. With this configuration, the same effect as that of the above-mentioned signal transmission apparatus according to the first aspect can be obtained by the configuration using one transformer.

What is claimed is:

1. A signal transmission apparatus, comprising:
(a) a transmission circuit including
(i) a signal output sub-circuit configured to
output a first pulse signal with a first frequency for a first fixed period of time according to a first pulse edge at which a first input signal externally input changes from a first level of binary levels to a second level of binary levels, and
output a second pulse signal with a second frequency for a second fixed period of time according to a second pulse edge at which the first input signal changes from the second level of binary levels to the first level of binary levels, and
(ii) a modulation sub-circuit configured to,
in response to a second input signal externally input indicating an active level,
output the second pulse signal for a third fixed period of time according to the second pulse edge at which the first input signal changes from the second level of binary levels to the first level of binary levels and then change a frequency of the second pulse signal to a third frequency;
(b) a first transformer and a second transformer configured to
receive the first pulse signal and the second pulse signal at a first primary winding and a second primary winding and
output a first induced signal and a second induced signal from a first secondary winding and a second secondary winding, respectively; and
(c) a reception circuit configured to
change a first level of binary levels of a first output signal to a second level of binary levels of the first output signal according to the first induced signal,
change the second level of binary levels of the first output signal to the first level of binary levels of the first output signal according to the second induced signal, and
change a second output signal to an active level in response to detecting that a frequency of the second induced signal has changed to the third frequency.

2. The signal transmission apparatus according to claim 1, wherein:
the modulation sub-circuit in the transmission circuit is further configured to set the third frequency to a value lower than each of the first frequency and the second frequency; and
the reception circuit includes
an RS flip-flop configured to be set by the first induced signal and reset by the second induced signal to change the binary levels of the first output signal,
a first latch circuit configured to be triggered by the second induced signal and to output a signal indicating an active level,
a second latch circuit connected in series with the first latch circuit, the second latch circuit being configured to be triggered based on a set signal level of the RS flip-flop to output the second output signal, and
a timer configured to be reset by the second induced signal and to reset the first latch circuit in response to completing measuring a clocked period of time, the clocked period of time being set (i) shorter than a period of time in which the binary levels of the first output signal changes and (ii) longer than a cycle of the third frequency.

3. The signal transmission apparatus according to claim 1, wherein:

the modulation sub-circuit in the transmission circuit is further configured to set the third frequency to a value lower than each of the first frequency and the second frequency; and the reception circuit includes an RS flip-flop configured to be set by the first induced signal and reset by the second induced signal to change the binary levels of the first output signal, a first latch circuit configured to be triggered by the second induced signal and to output a signal indicating an active level, a second latch circuit connected in series with the first latch circuit, the second latch circuit configured to be triggered by a clock signal with a cycle that is shorter than a cycle of the third frequency to output the second output signal, a selector configured to select either an output signal of the first latch circuit or an output signal of the second latch circuit to output the second output signal, a first timer configured to be reset by the second induced signal and to reset the first latch circuit in response to completing measuring a clocked period of time, the clocked period of time being set (i) shorter than a period of time in which the binary levels of the first output signal changes and (ii) longer than a cycle of the third frequency, and a second timer configured to be activated by a reset signal level of the RS flip-flop, the second timer switching a selection state of the selector from the output signal of the second latch circuit to the output signal of the first latch circuit in response to completing measuring a clocked period of time, the clocked period of time being set longer than a cycle of the first frequency.

4. The signal transmission apparatus according to claim 1, wherein:

the modulation sub-circuit changes an amplitude of the second pulse signal in response to a third input signal externally input indicating an active level; and the reception circuit changes a third output signal to an active level in response to detecting that a frequency of the second induced signal changes to the third frequency and an amplitude of the second induced signal changes.

5. The signal transmission apparatus according to claim 1, wherein:

the transmission circuit, the first transformer, the second transformer, and the reception circuit are sealed in one package.

6. A signal transmission apparatus, comprising:

a transmission circuit configured to output a pulse signal with a first frequency and a first amplitude value for a first fixed period of time according to a pulse edge at which a first input signal externally input changes from a first level of binary levels to a second level of binary levels, change a frequency of the pulse signal to a second frequency according to a pulse edge at which the first input signal changes from the second level of binary levels to the first level of binary levels, output the pulse signal with the first frequency and a second amplitude value according to a pulse edge at which a second input signal externally input changes from a first level of binary levels to a second level of binary levels, and change the frequency of the pulse signal to the second frequency according to a pulse edge at which the second input signal changes from the second level of binary levels to the first level of binary levels;

a transformer configured to receive the pulse signal at a primary winding and output an induced signal from a secondary winding; and a reception circuit configured to change a first level of binary levels of a first output signal to a second level of binary levels of the first output signal in response to the induced signal having the first frequency and the first amplitude value, change the second level of binary levels of the first output signal to the first level of binary levels of the first output signal in response to the induced signal having the second frequency and the first amplitude value, change a first level of binary levels of a second output signal to a second level of binary levels of the second output signal in response to the induced signal having the first frequency and the second amplitude value, and change the second level of binary levels of the second output signal to the first level of binary levels of the second output signal in response to the induced signal having the second frequency and the second amplitude value.

7. The signal transmission apparatus according to claim 6, wherein:

the transmission circuit, the transformer, and the reception circuit are sealed in one package.

* * * * *